United States Patent
Chen et al.

(10) Patent No.: US 8,369,154 B2
(45) Date of Patent: Feb. 5, 2013

(54) CHANNEL HOT ELECTRON INJECTION PROGRAMMING METHOD AND RELATED DEVICE

(75) Inventors: Ying-Je Chen, Taichung (TW); Yun-Jen Ting, Hsinchu County (TW); Wein-Town Sun, Taoyuan County (TW); Kai-Yuan Hsiao, Taichung (TW); Cheng-Jye Liu, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 321 days.

(21) Appl. No.: 12/944,711

(22) Filed: Nov. 11, 2010

(65) Prior Publication Data

US 2011/0235427 A1    Sep. 29, 2011

Related U.S. Application Data

(60) Provisional application No. 61/316,843, filed on Mar. 24, 2010.

(51) Int. Cl.
*G11C 11/34* (2006.01)

(52) U.S. Cl. ......... 365/185.21; 365/185.19; 365/185.22; 365/185.24

(58) Field of Classification Search ............. 365/185.19, 365/185.21, 185.22, 185.24
See application file for complete search history.

(56) References Cited

U.S. PATENT DOCUMENTS

| | | | |
|---|---|---|---|
| 4,357,685 A | 11/1982 | Daniele | |
| 4,628,487 A | 12/1986 | Smayling | |
| 5,812,457 A | 9/1998 | Arase | |
| 5,892,714 A | 4/1999 | Choi | |
| 6,040,996 A | 3/2000 | Kong | |
| 6,219,279 B1 | 4/2001 | Manolescu | |
| 6,621,742 B1 | 9/2003 | Yamada | |
| 7,154,783 B2 * | 12/2006 | Lee et al. | 365/185.11 |
| 7,251,163 B2 * | 7/2007 | O | 365/185.18 |
| 7,633,807 B2 | 12/2009 | Chen | |
| 2001/0046174 A1 | 11/2001 | Ma | |
| 2008/0181013 A1 * | 7/2008 | Chou et al. | 365/185.21 |
| 2009/0219762 A1 | 9/2009 | Mawatari | |

FOREIGN PATENT DOCUMENTS

| | | |
|---|---|---|
| JP | H0621404 A | 1/1994 |
| JP | H0877783 A | 3/1996 |
| JP | H0991980 A | 4/1997 |
| JP | H09181204 A | 7/1997 |
| JP | H09260518 A | 10/1997 |
| JP | H11260080 A | 9/1999 |

(Continued)

OTHER PUBLICATIONS

Non-Volatile Memory White Paper "Non-Volatile Memory: The principles, the technologies, and their significance to the smart card integrated circuit" by David Sowards, 1999 Emosyn and Silicon Storage Technology, p. 1-13.

*Primary Examiner* — Vu Le
*Assistant Examiner* — Han Yang
(74) *Attorney, Agent, or Firm* — Winston Hsu; Scott Margo

(57) ABSTRACT

A nonvolatile memory device for reducing programming current and improving reliability comprises a memory cell array, a write circuit, and a verification circuit. The memory cell array comprises memory cells arranged at crossing points of a bit-line and word-line matrix of the memory cell array. The write circuit provides multiple variable pulses to each word-line for programming. The multiple variable pulses have predetermined amplitude for keeping gate injection current roughly maximum while lowering conduction current during programming operation. The verification circuit senses variation of the conduction current during the programming operation, and disables the programming operation if the sensed conduction current during the programming operation reaches a predetermined value.

21 Claims, 16 Drawing Sheets

FOREIGN PATENT DOCUMENTS

| | | |
|---|---|---|
| JP | 2000306390 A | 11/2000 |
| JP | 2001506063 A | 5/2001 |
| JP | 2002319293 A | 10/2002 |
| JP | 200463059 A | 2/2004 |
| JP | 2004281841 A | 10/2004 |
| JP | 2004281970 A | 10/2004 |
| JP | 2004281971 A | 10/2004 |
| JP | 2004327804 A | 11/2004 |
| JP | 2005533372 A | 11/2005 |
| JP | 2006173565 A | 6/2006 |
| JP | 2006313640 A | 11/2006 |
| JP | 2007142398 A | 6/2007 |
| JP | 200884523 A | 4/2008 |
| JP | 2008118040 A | 5/2008 |
| JP | 2009503763 A | 1/2009 |
| JP | 2009506472 A | 2/2009 |
| WO | 9919880 A1 | 4/1999 |
| WO | 02073623 A1 | 9/2002 |
| WO | 2004006340 A1 | 1/2004 |
| WO | 2004072981 A1 | 8/2004 |
| WO | 2007019010 A1 | 2/2007 |
| WO | 2007024565 A2 | 3/2007 |

\* cited by examiner

CHANNEL HOT ELECTRON INJECTION PROGRAMMING METHOD AND RELATED DEVICE

CROSS REFERENCE TO RELATED APPLICATIONS

This application claims the benefit of U.S. Provisional Application No. 61/316,843, filed on Mar. 24, 2010, and entitled "P-channel Ramping CHEI Programming Method By Auto Tracing Vt Shift," the contents of which are incorporated herein by reference.

BACKGROUND OF THE INVENTION

1. Field of the Invention

The present invention relates to methods of performing channel hot electron injection (CHEI) programming and related device, and more particularly to a method of performing CHEI programming that reduces programming current and improves reliability, program efficiency, and related device.

2. Description of the Prior Art

Non-volatile memory is a type of memory that retains information even when no power is supplied to memory blocks thereof. Some examples include magnetic devices, optical discs, flash memory, and other semiconductor-based memory topologies. Some forms of non-volatile memory have bits defined in fabrication, some may be programmed only once (one time programmable ROM, OTP ROM), and other types may be programmed and reprogrammed many times over. As semiconductor memory technologies have matured, memory cell programming and reading times have decreased (making memory cells faster), require less current/power to operate, and have improved reliability. Further, program bias voltage decreases in mature technology.

Memory cells are typically programmed through CHEI. CHEI occurs when channel carriers traveling from source to drain of a metal-oxide-semiconductor (MOS) transistor are heated due to drain-source voltage applied across the drain and the source. The hot electrons at the end of the channel have high energy, and are injected into a floating gate of the MOS transistor approximately in a direction perpendicular to the floating gate. However, a corner effect causes multiple issues when using CHEI to program, including longer programming time, wider distribution, higher power consumption, and lower reliability due to hole damage. To compensate for the corner effect, circuit design becomes more complex and requires larger area.

Please refer to FIG. 1, which is a diagram illustrating a memory cell 10 comprising a memory transistor 100 and a select transistor 110 according to the prior art. As shown in FIG. 1, a control line voltage ZCL is connected to the gate of the memory transistor 100, and a bit line voltage BL is connected to the drain of the memory transistor 100. Moreover, a word line voltage ZWL is connected to the gate of the select transistor 110 and a source line voltage SL is connected to the source of the select transistor 110. The source line and the n well NW are at a common voltage level (VSL=VNW).

Please refer to FIG. 2 and FIG. 3, which are a diagram illustrating gate current versus gate voltage for a fixed control line voltage ZCL, and a diagram illustrating threshold voltage and CHEI current versus time for the fixed control line voltage, respectively. At an initial programming voltage Vt_ers corresponding to the memory transistor 100 being in an erased state, gate current obtained by applying the control line voltage ZCL is higher near the initial programming voltage Vt_ers, and lower the further away the control line voltage ZCL is from the initial programming voltage Vt_ers. However, during programming, threshold voltage Vt of the memory transistor 100 may shift. Thus, when the control line voltage ZCL applied during programming is fixed, a channel hot electron injection (CHEI) current profile obtained over time approximates that shown in FIG. 3 (convolution of the two areas shown in FIG. 2). As shown in FIG. 3, CHEI current is initially high and threshold voltage Vt of the memory transistor 100 increases rapidly. However, as the threshold voltage Vt increases, the CHEI current tapers off, and increase of the threshold voltage Vt slows down. This behavior leads to slow, inefficient programming of the memory transistor 100.

SUMMARY OF THE INVENTION

According to an embodiment, a method of programming a nonvolatile memory cell which comprises a select transistor and a memory transistor comprises applying a control line voltage to a control line input of the memory transistor, applying a source line voltage to a source line input of the select transistor, sensing conduction current of the nonvolatile memory cell, and increasing the control line voltage applied to the control line input of the nonvolatile memory cell after the conduction current reaches a predetermined value.

According to an embodiment, a nonvolatile memory device for reducing programming current and improving reliability comprises a memory cell array, a write circuit, and a verification circuit. The memory cell array comprises memory cells arranged at cross points of a bit-line and word-line matrix of the memory cell array. The write circuit provides multiple variable pulses to each word-line for programming. The multiple variable pulses have predetermined amplitude for keeping gate injection current at a predetermined level during programming operation. The verification circuit senses variation of the conduction current during the programming operation, and disables the programming operation if the sensed conduction current during the programming operation reaches a predetermined value.

According to an embodiment, a method of programming a nonvolatile memory cell comprises applying a word line voltage to a word line input of the nonvolatile memory cell, applying a bit line voltage to a bit line input of the nonvolatile memory cell, sensing conduction current of the nonvolatile memory cell, and increasing the word line voltage applied to the word line input of the nonvolatile memory cell after the conduction current reaches a predetermined value.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
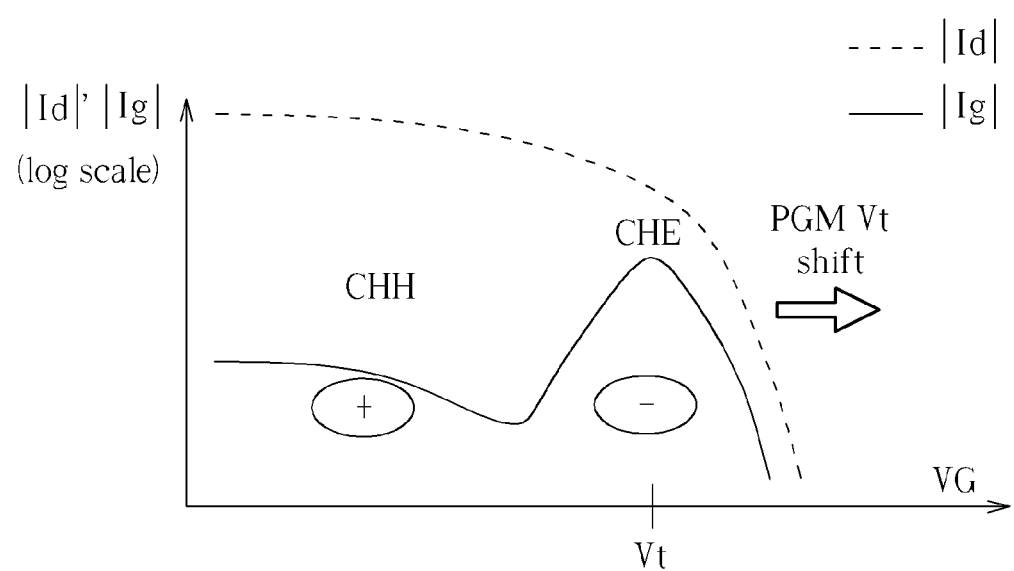
FIG. 4 is a diagram illustrating gate current and drain current as a function of gate voltage applied to a memory cell.

Please refer to FIG. 4, which illustrates gate current |Ig| and drain current |Id| as a function of gate voltage VG applied to a memory cell. The gate voltage VG may be a control line voltage applied through a control line to a control line input, such as a gate, of the memory transistor 100. Assuming the memory transistor 100 has an initial threshold voltage Vt, as gate voltage VG (signal ZCL) applied to a gate of the memory transistor 100 approaches the threshold voltage Vt, channel hot electron (CHE) injection occurs, and gate current |Ig| is maximized. Below the threshold voltage Vt, gate voltage VG results in lower gate current |Ig|, eventually leading to channel hot hole (CHH) injection, which may damage the memory transistor 100. Above the threshold voltage Vt, gate voltage VG results in diminishing gate current |Ig|, and drain current |Id| also drops off. As shown in FIG. 4, during programming, threshold voltage Vt increases as electrons are injected into a floating gate or ONO layer 102 of the memory transistor 100. Knowing this threshold voltage Vt shift phenomenon, by programming at a slightly increased gate voltage VG, e.g. 0.5 Volts over threshold voltage Vt, gate current |Ig| may be kept at a higher level for a greater proportion of the programming cycle, leading to faster programming time, and risk of dropping into CHH injection may also be reduced. Chip area may be reduced as conduction current is relatively low.

Figure 5:
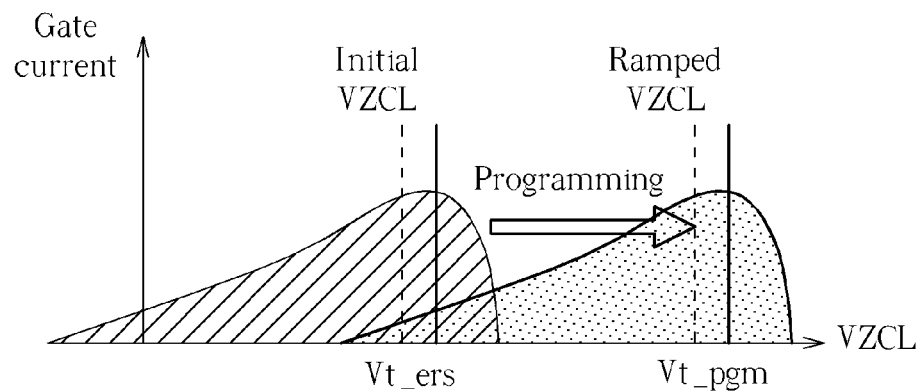
FIG. 5 is a diagram illustrating gate current versus gate voltage for a ramped control line voltage.
Figure 6:
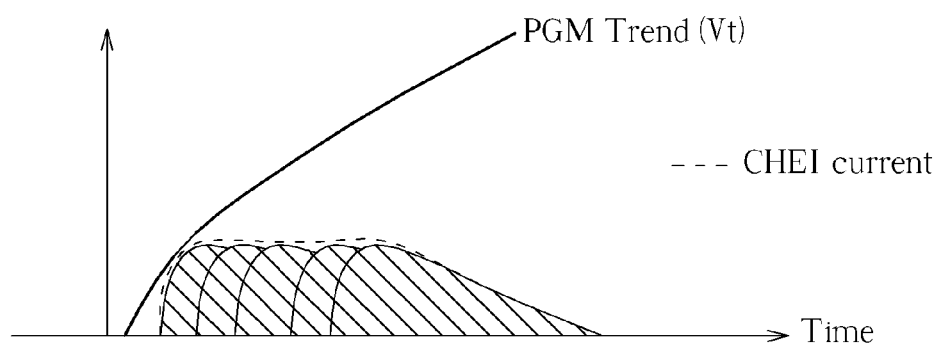
FIG. 6 is a diagram illustrating threshold voltage and CHEI current versus time for the ramped control line voltage.

Please refer to FIG. 5 and FIG. 6, which are diagrams illustrating gate current versus gate voltage (FIG. 5) and threshold voltage and CHEI current versus time (FIG. 6) for a ramped control line voltage programming method according to an embodiment. In a preferred mode, gate voltage VG applied to the memory transistor 100 during programming increases with threshold voltage shift. As shown in FIG. 5, initial gate voltage (left dashed line) is applied to maximize gate current (left hump peaks near initial gate voltage). As programming progresses, threshold voltage of the memory transistor 100 increases, such that initial gate voltage may be lower than erase voltage Vt_ers (left solid line). Simultaneously, threshold voltage of the memory transistor 100 is already at a higher voltage Vt_pgm. Thus, by ramping gate voltage applied to the memory transistor 100 with increasing threshold voltage (right hump peaks near Vt_pgm), the memory transistor 100 may be programmed by gate injection current at a predetermined level, e.g. roughly maximum gate current. Stepped ramping of gate voltage is shown conceptually in FIG. 6, where CHEI current is kept roughly maximum throughout programming, leading to rapid increase of threshold voltage Vt over time.

Figure 7:
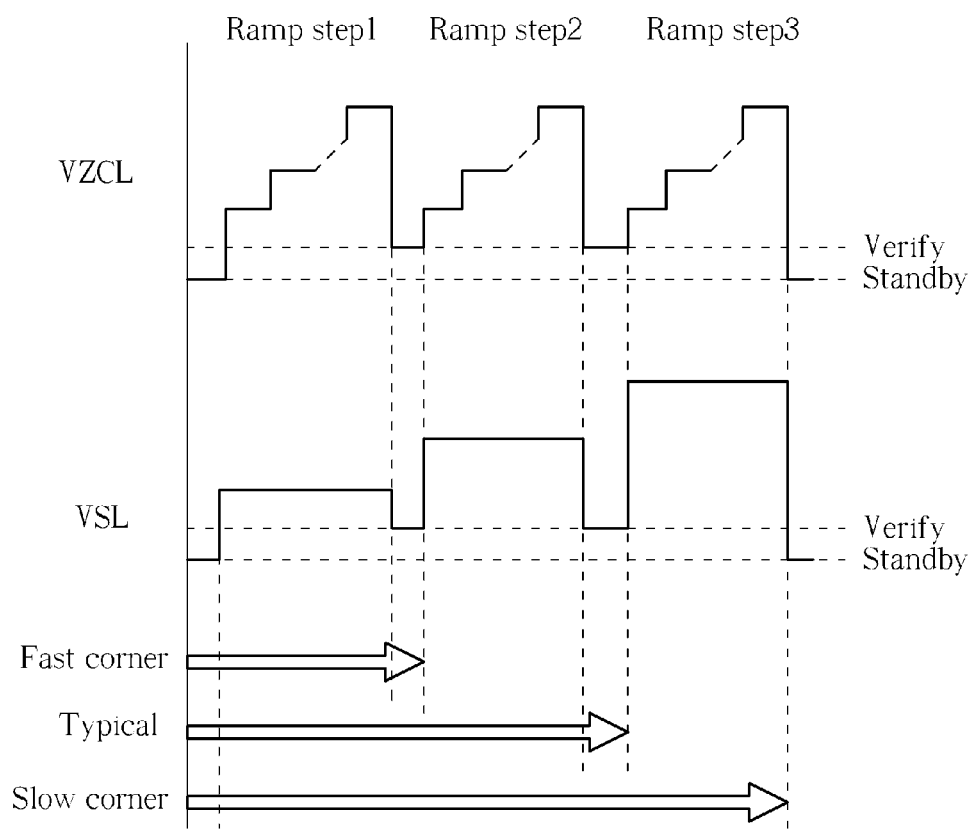
FIG. 7 is a timing diagram of control line signal and source line voltage signal according to an embodiment.

Please refer to FIG. 7, which is a timing diagram of control line signal (VZCL) and source line voltage signal VSL according to an embodiment. As shown in FIG. 7, control line signal VZCL applied to gate of the memory transistor 100 is ramped, and source line voltage signal VSL applied to source line 110 may also be ramped. Ramping the source line voltage signal VSL increases source line (SL) to bit line (BL) bias (BL voltage=0 volt), which also leads to better programming results. In the embodiment shown in FIG. 7, each increase in SL to BL bias corresponds to a ramp of control line signal VZCL. Number of steps in the ramp of control line signal VZCL is not limited herein, and is preferably at least one. Following each ramp of control line signal VZCL, a verification process is performed. Once verification is finished, if verification fails, further programming is required, so SL to BL bias is increased, and ramp of control line signal VZCL restarts. If verification passes, the control line signal VZCL and the source line voltage signal VSL may each enter a standby mode to stop programming. As shown in FIG. 7, three cycles may be employed to cover fast corner, typical, and slow corner memory cells. Fast corner memory cells pass verification after one programming ramp, typical memory cells pass verification after two programming ramps, and slow corner memory cells may pass verification after three programming ramps.

Figure 8:
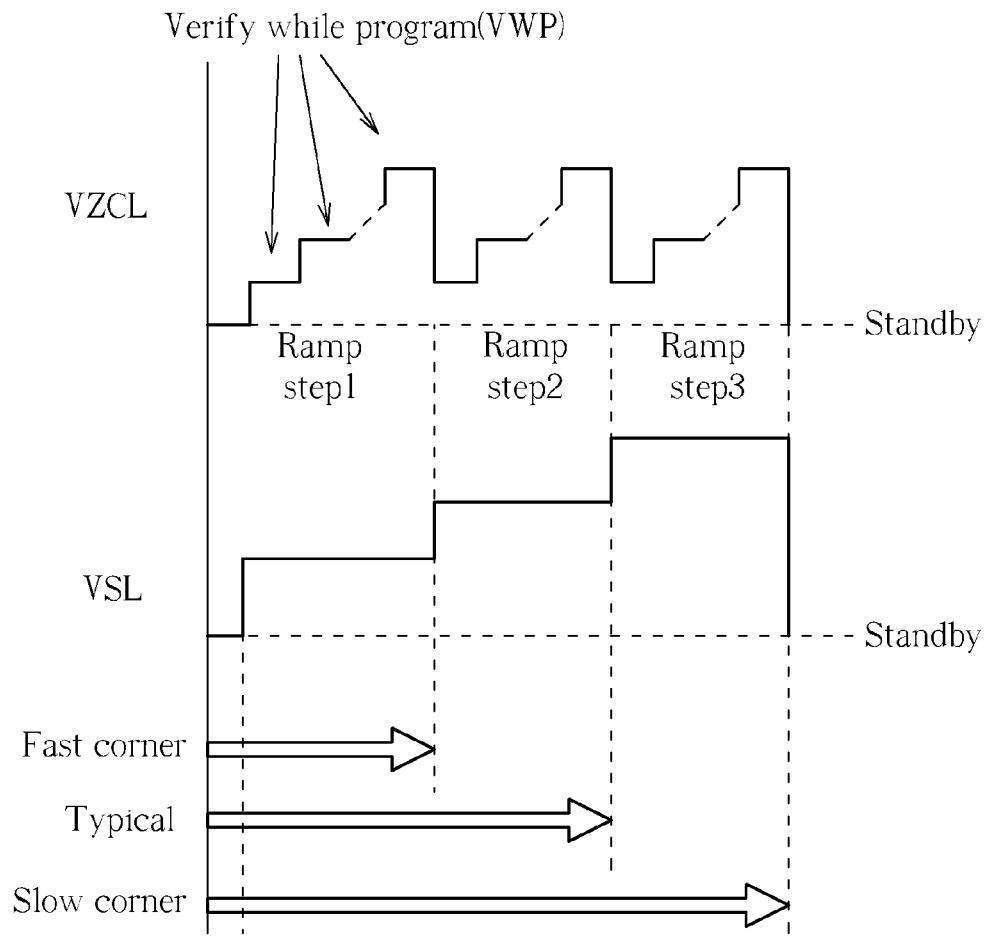
FIG. 8 is a timing diagram of control line signal and source line voltage signal according to another embodiment.

Please refer to FIG. 8, which is a timing diagram of control line signal (VZCL) and source line voltage signal VSL according to another embodiment. The timing diagram shown in FIG. 8 is similar to the diagram shown in FIG. 7, except that verification is performed during programming (Verify While Program, VWP). Thus, when one ramp of control line signal VZCL is finished, a new ramp of control line signal VZCL begins immediately thereafter, without a pause for verification.

Figure 9:
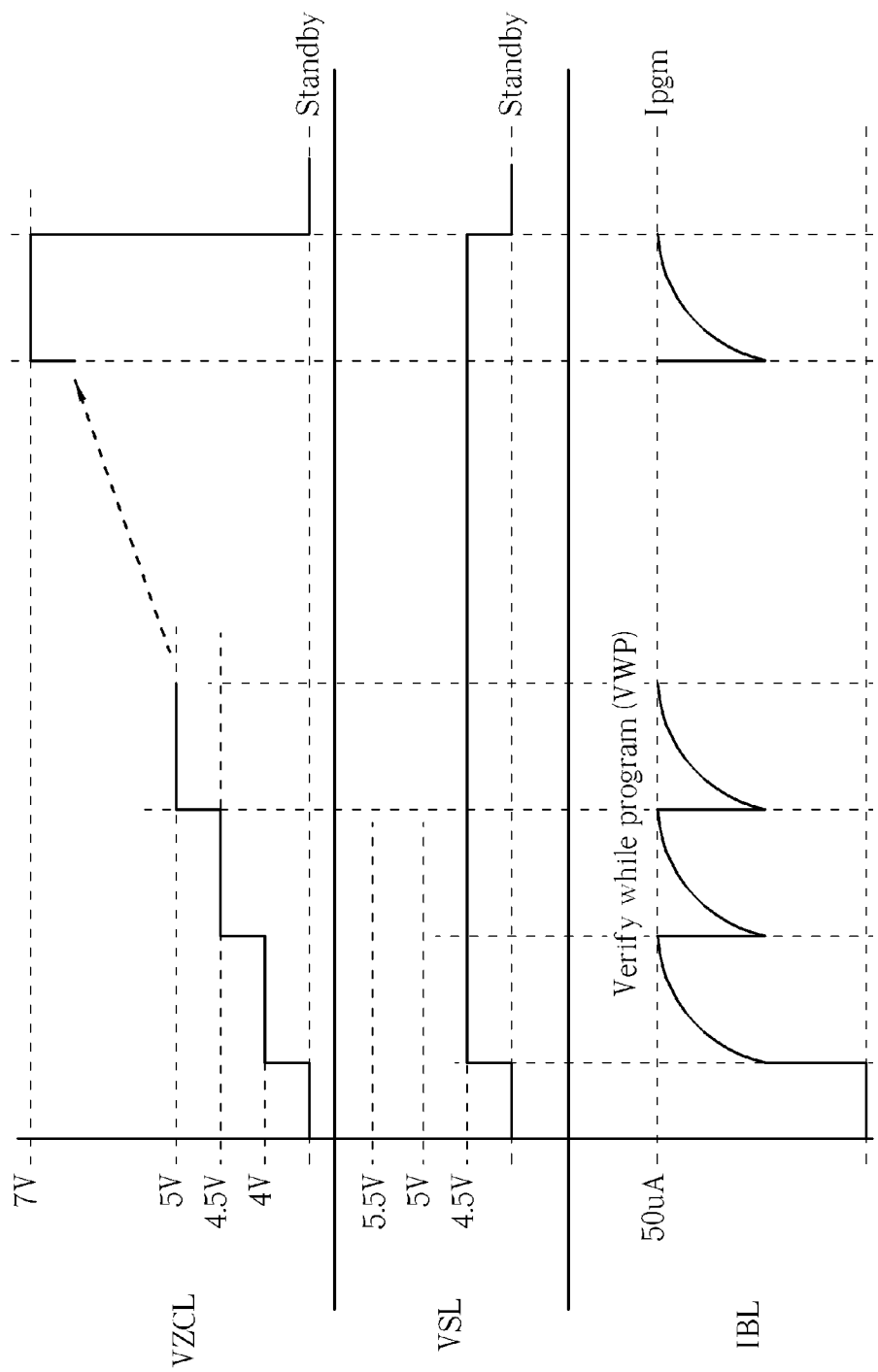
FIG. 9 is a timing diagram illustrating programming of a fast corner memory cell with verify-while-programming (VWP).
Figure 10:
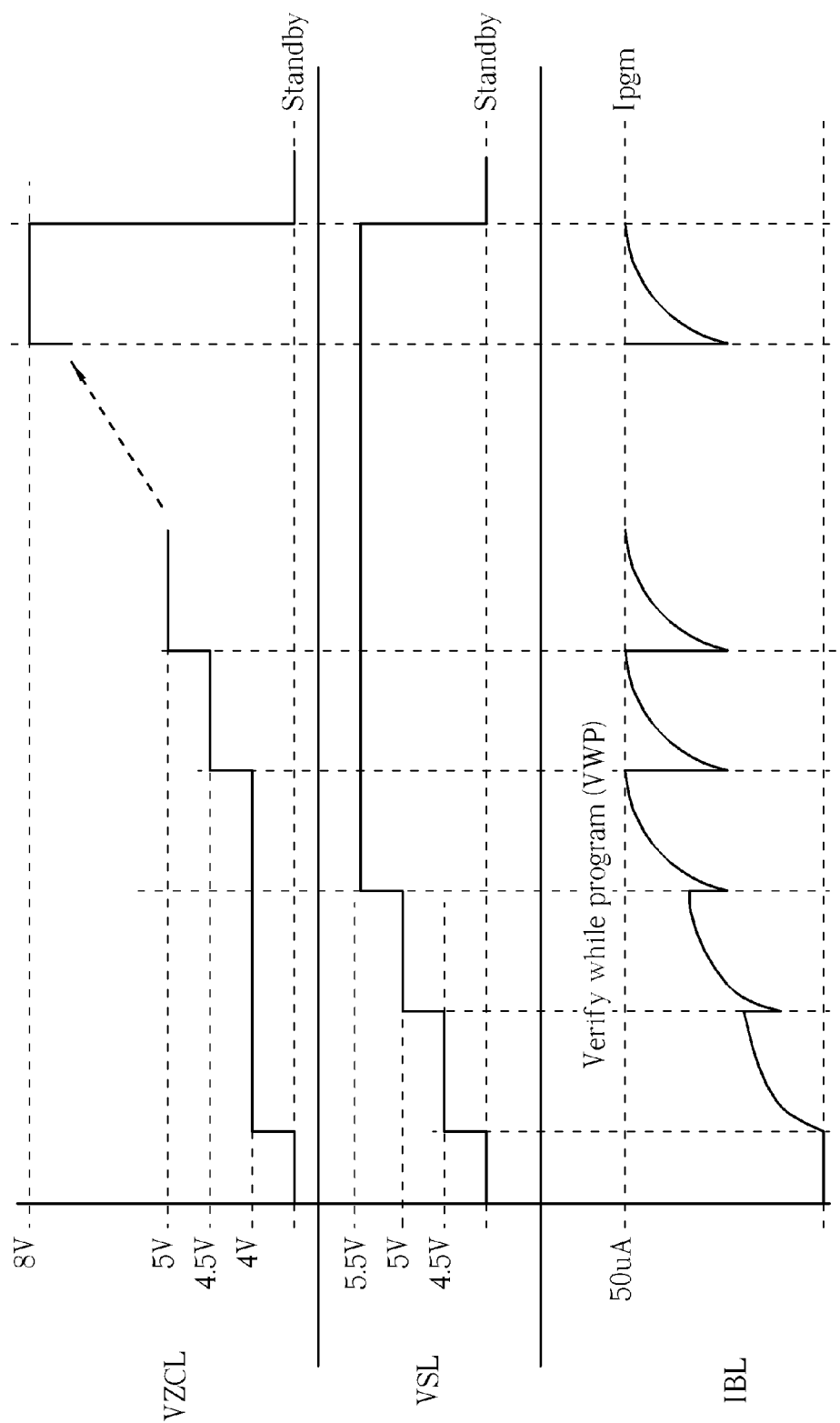
FIG. 10 is a timing diagram illustrating programming of a slow corner memory cell with VWP.

Please refer to FIG. 9 and FIG. 10. FIG. 9 is a timing diagram illustrating programming of a fast corner memory cell with VWP. FIG. 10 is a timing diagram illustrating programming of a slow corner memory cell with VWP. Voltages and times shown in FIG. 9 and FIG. 10 are provided as an example, but are not intended to limit the scope of the embodiment. To achieve high speed and low power consumption, control line signal VZCL is ramped. Start bias of control line signal VZCL may be close to initial threshold voltage Vt_start, and final bias may determine final programming threshold voltage Vt_final. To overcome device variation and disturb, SL to BL bias is ramped by ramping source line voltage signal VSL. For a fast corner memory cell (FIG. 9), one ramp of control line signal VZCL may be sufficient to complete programming, such that source line voltage signal VSL is kept constant throughout programming, and is not ramped. For a slow corner memory cell (FIG. 10), source line voltage signal VSL may be ramped until sufficiently high gate current is detected, e.g. 50 micro amps (μA), at which time control line signal VZCL may start to be ramped until programming is complete. As shown in FIG. 9 and FIG. 10, each step of ramping control line signal VZCL may begin upon reaching programming current Ipgm, e.g. 50 µA; each step of ramping SL to BL bias may begin upon reaching maximum programming time, e.g. 5 microseconds (us), without having reached programming current Ipgm. Please note that maximum programming time may be applied to both ramping source line voltage signal VSL and ramping control line signal VZCL. In another embodiment, maximum programming time may be applied to ramping source line voltage signal VSL, and a ramping programming time may be applied to ramping control line signal VZCL, where ramping programming time is shorter (faster) than maximum programming time.

Figure 11:
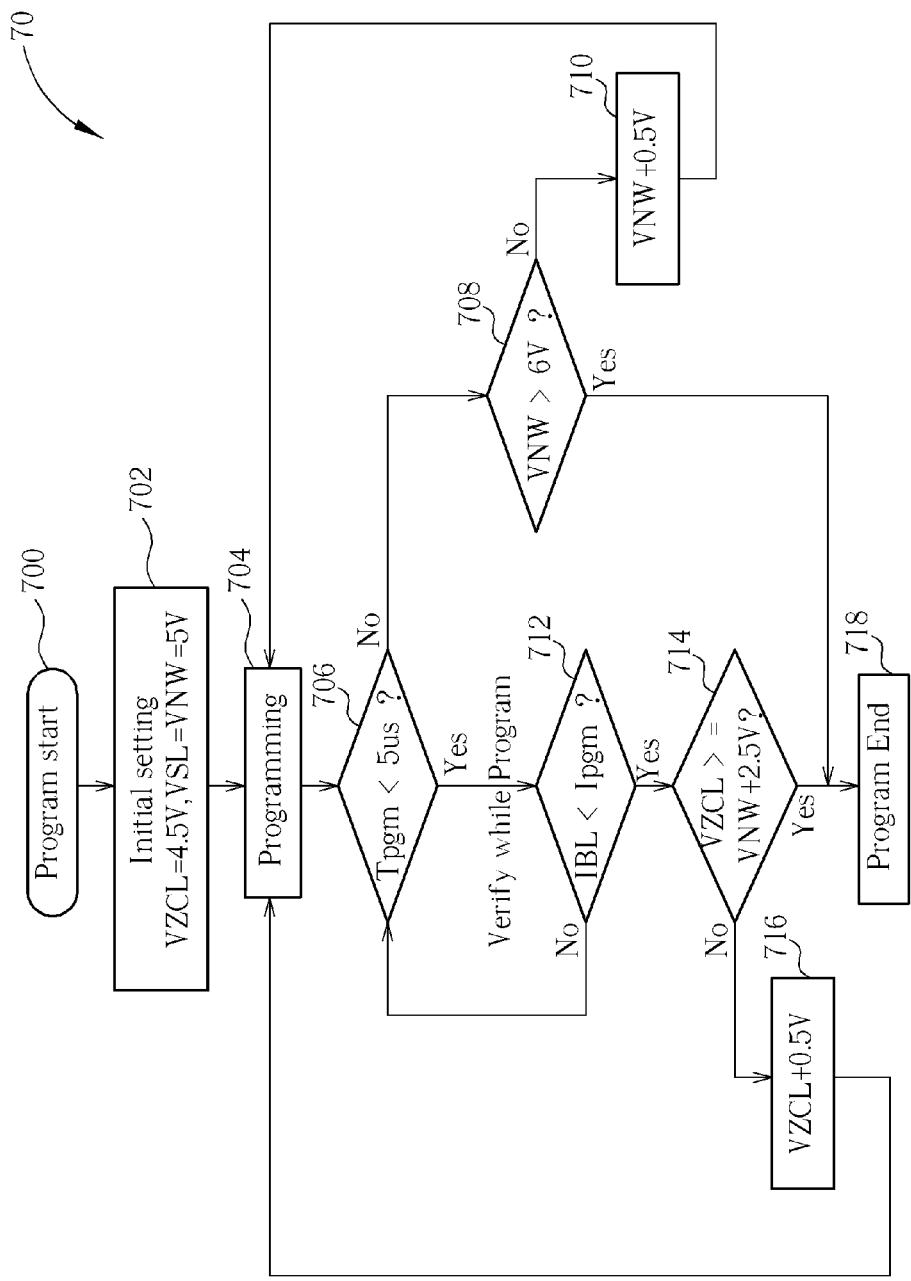
FIG. 11 is a flow chart of a process for performing channel hot electron injection programming with VWP according to an embodiment.

Please refer to FIG. 11, which is a flow chart of a process 70 for performing channel hot electron injection (CHEI) programming with VWP according to an embodiment. Programming starts (Step 700) when programming of a memory cell is required. Initial settings are applied to the memory transistor and corresponding select transistor, e.g. VZCL=4.5 Volts, VSL=VNW=5V, VBL=0 Volts, where VNW represents n-well voltage (Step 702). Programming is performed as described above (Step 704). If programming time Tpgm exceeds a predetermined period (Step 706), e.g. 5 us, and n-well voltage VNW is lower than a first voltage threshold (Step 708), e.g. 6V, n-well voltage is increased by a first step voltage (Step 710), e.g. 0.5V. If programming time Tpgm exceeds the predetermined period (Step 706), and n-well voltage VNW is higher than the first voltage threshold (Step 708), then programming ends (Step 718), possibly due to a memory cell that is too slow. If programming time Tpgm is less than the predetermined period (Step 706), and bit line current IBL is lower than predetermined programming current Ipgm (Step 712), e.g. 50 µA, the process 70 returns to Step 706. If bit line current IBL exceeds predetermined programming current Ipgm (Step 712) while programming time Tpgm is less than the predetermined period (Step 706), and control line signal VZCL is less than a gate voltage threshold (Step 714), e.g. VNW+2.5V, control line signal VZCL is increased by a second step voltage (Step 716), e.g. 0.5V. The first step voltage and the second step voltage may be the same or different. If the control line signal VZCL is greater than or equal to the gate threshold voltage, programming ends (Step 718). In the above, the first voltage threshold may be a predetermined control line voltage limit of the control line voltage applied to the control line of the memory transistor 100.

Figure 12:
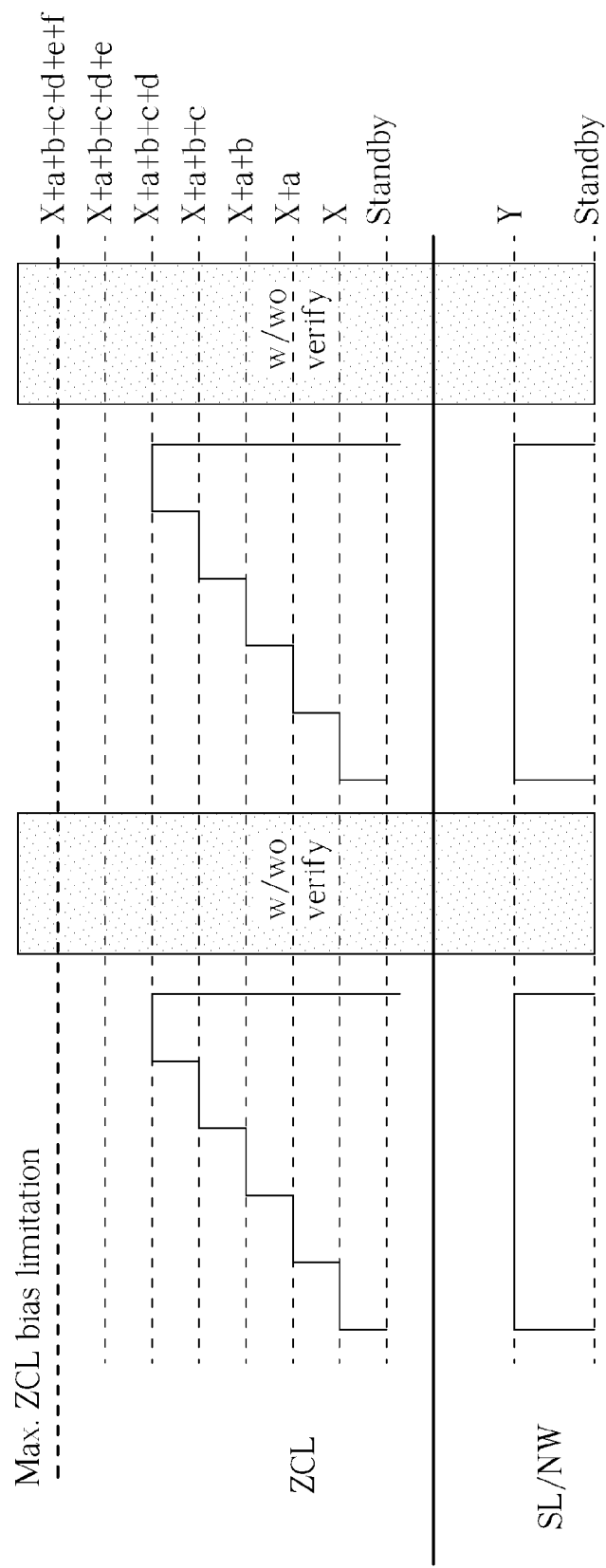
FIG. 12 is a diagram illustrating ramping of gate voltage according to an embodiment.

Please refer to FIG. 12, which is a diagram illustrating ramping of gate voltage ZCL according to an embodiment. Source line voltage SL, which may roughly equal n-well voltage NW, may be kept constant during programming at a voltage Y. Gate voltage ZCL may be set initially to a voltage X, which is higher than a standby voltage, during programming. A step voltage "a" may be added to the voltage X in a first step, a step voltage "b" may be added to the voltage X+a in a second step, and so forth until a step voltage X+a+b+c+d is reached. Verification may be performed, and a new ramp may begin from the voltage X. A maximum bias limitation may be set for gate voltage ZCL roughly equal to a voltage X+a+b+c+d+e+f. Voltage steps a, b, c, . . . , f may be the same or different. Number of voltage steps is also not limited herein.

Figure 13:
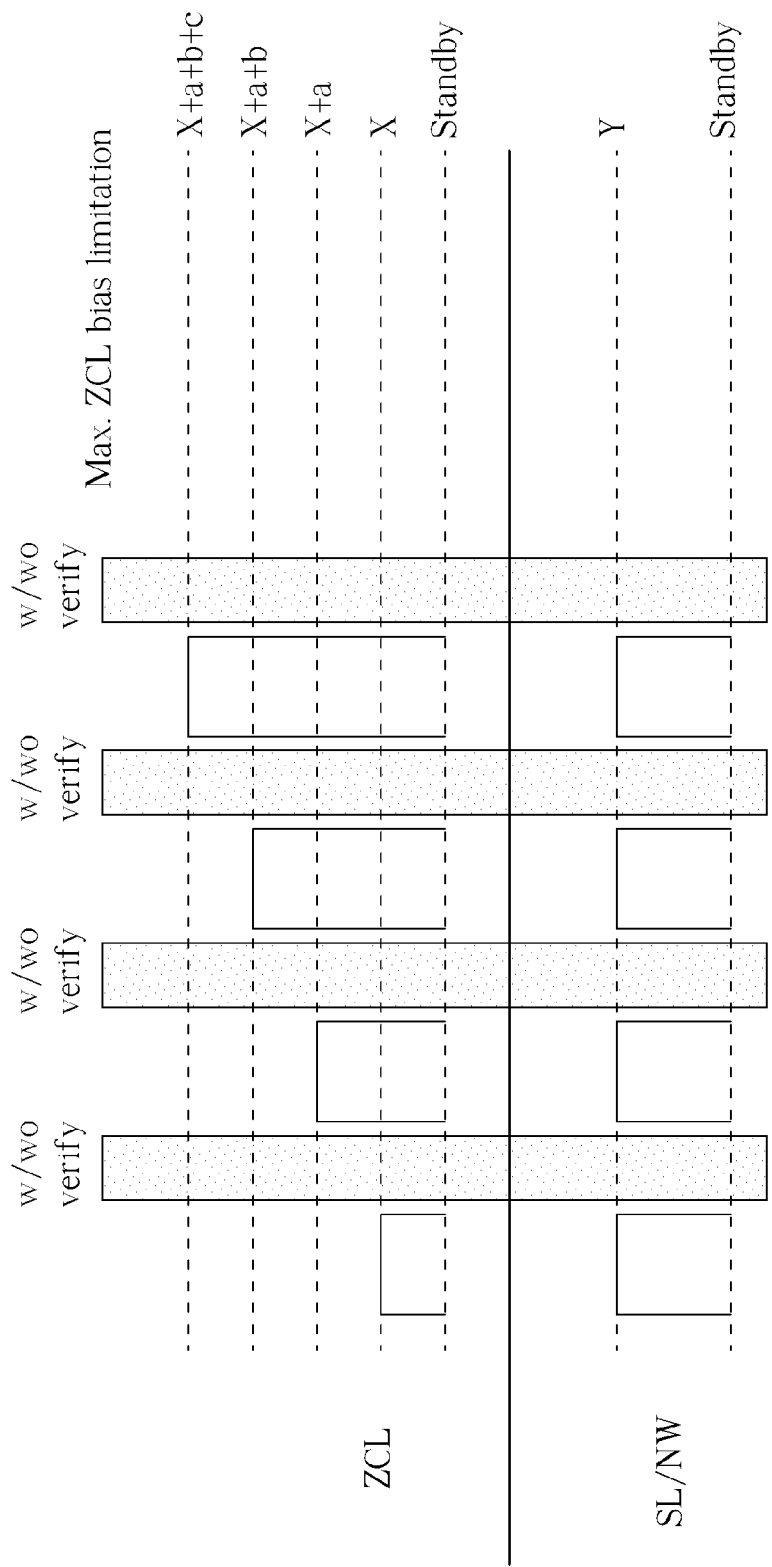
FIG. 13 is a diagram illustrating ramping of gate voltage according to another embodiment.

Please refer to FIG. 13, which is a diagram illustrating ramping of gate voltage ZCL according to another embodiment. Similar to FIG. 12, only gate voltage ZCL is ramped, and source line voltage SL is kept constant. However, unlike FIG. 12, in FIG. 13, verification may be performed after each step up in gate voltage ZCL. For example, after voltage X is applied, verification may be performed, then voltage X+a may be applied, verification may be performed, and so forth.

Figure 14:
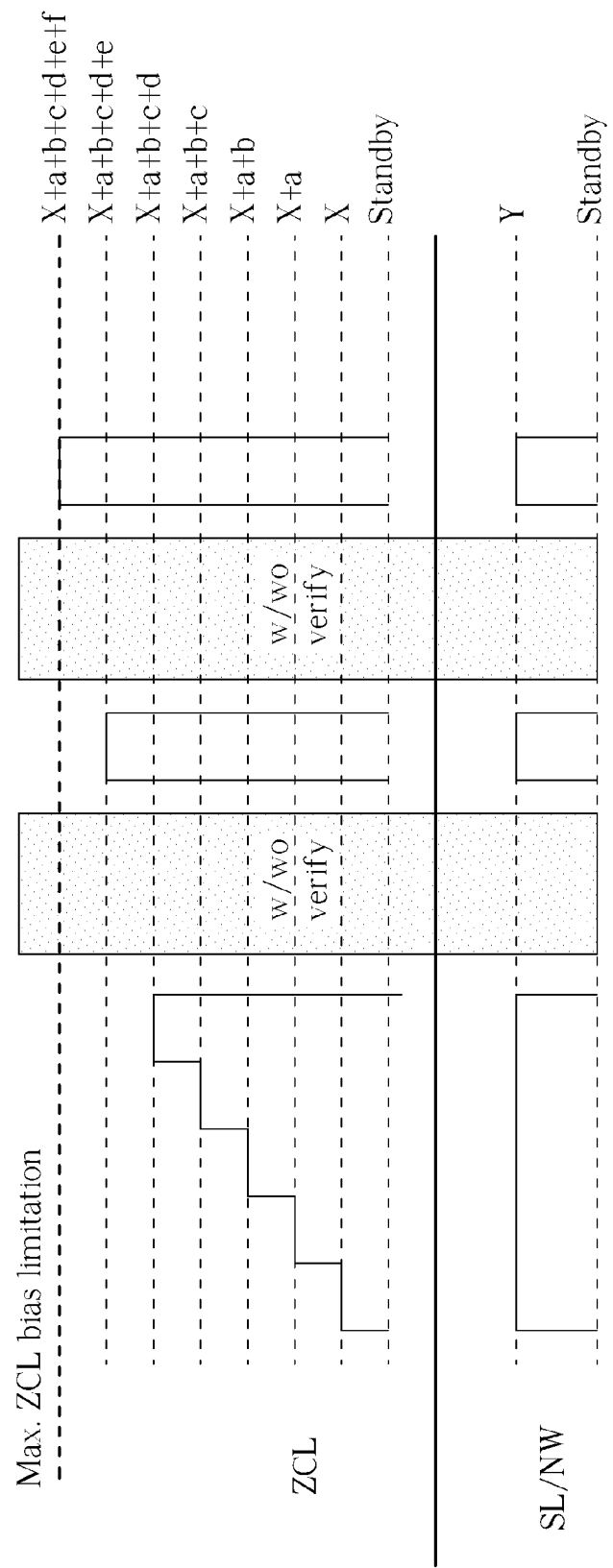
FIG. 14 is a diagram illustrating ramping of gate voltage according to another embodiment.

Please refer to FIG. 14, which is a diagram illustrating ramping of gate voltage ZCL according to another embodiment. FIG. 14 combines FIG. 12 and FIG. 13. Initially, ramping is performed on gate voltage ZCL uninterrupted, until voltage X+a+b+c+d is reached. Then, verification may be performed before stepping up to voltage X+a+b+c+d+e. Verification may be performed again, then gate voltage ZCL may be stepped up to voltage X+a+b+c+d+e+f. Order of the combination of FIG. 12 and FIG. 13 is not limited to that shown in FIG. 14. FIG. 14 illustrates the ramping of FIG. 12 preceding the ramping of FIG. 13, but the ramping of FIG. 13 may also precede the ramping of FIG. 12.

Figure 15:
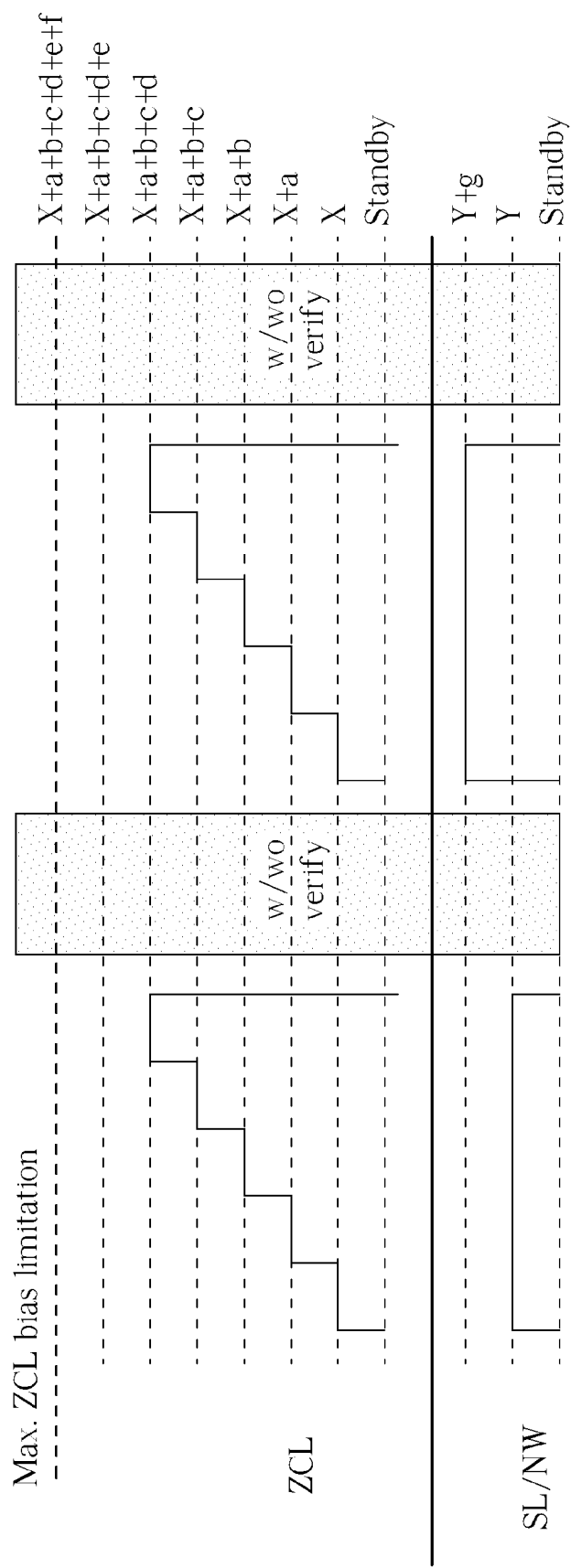
FIG. 15 is a diagram illustrating ramping gate voltage and source line/n-well voltages according to an embodiment.

Please refer to FIG. 15, which is a diagram illustrating ramping gate voltage ZCL and source line/n-well voltages SL/NW according to an embodiment. Gate voltage ZCL is stepped up from voltage X to voltage X+a+b+c+d, while source line/n-well voltages SL/NW are at voltage Y. Verification may be performed. Then, gate voltage ZCL is stepped up again starting from voltage X and increasing to voltage X+a+b+c+d, while source line/n-well voltages SL/NW are at voltage Y+g. Voltage "g" may be the same or different from voltages a, b, . . . , f.

Figure 16:
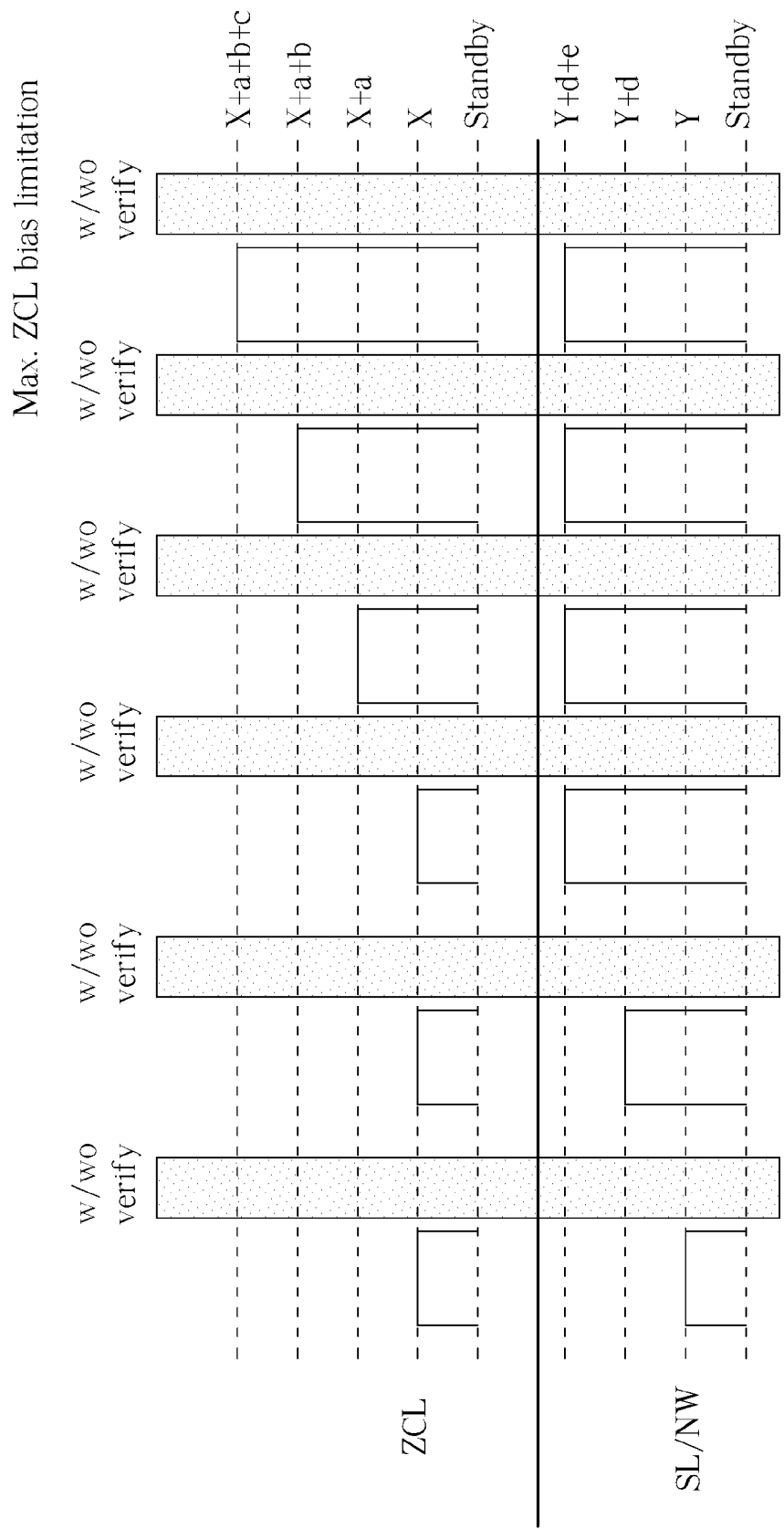
FIG. 16 is a diagram illustrating ramping gate voltage and source line/n-well voltages according to another embodiment.

Please refer to FIG. 16, which is a diagram illustrating ramping gate voltage ZCL and source line/n-well voltages SL/NW according to another embodiment. Initially, source line/n-well voltages SL/NW are stepped up from voltage Y to voltage Y+d, then to voltage Y+d+e. Verification may be performed following each step up in source line/n-well voltages. After reaching voltage Y+d+e, verification may be performed, then gate voltage ZCL may be stepped up from voltage X to voltage X+a, then to voltage X+a+b, then to voltage X+a+b+c, all while source line/n-well voltages SL/NW are at voltage Y+d+e. Verification may be performed after each step up in gate voltage ZCL.

Figure 17:
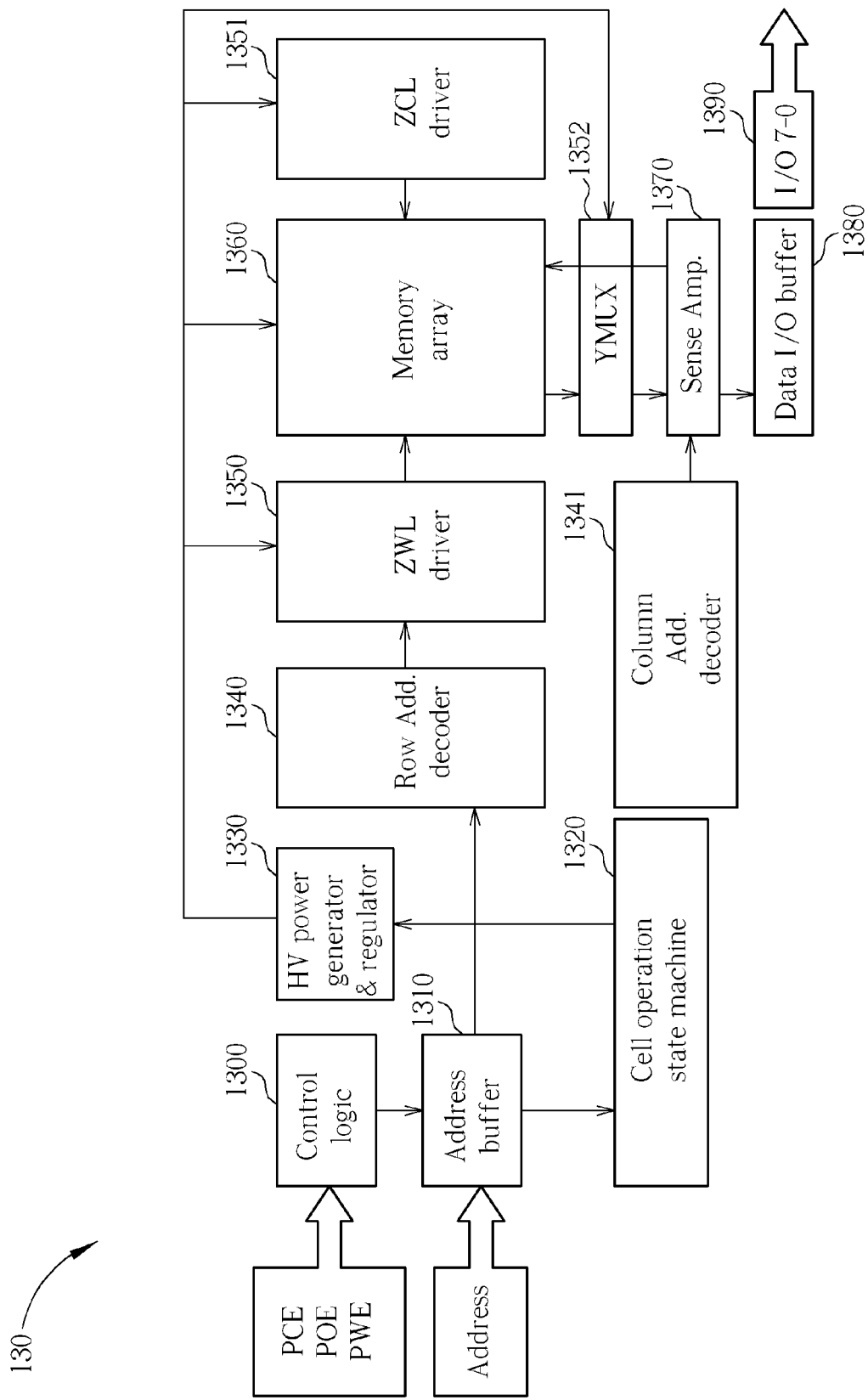
FIG. 17 is a diagram of a nonvolatile memory device for reducing programming current and improving reliability.

Please refer to FIG. 17, which is a diagram of a nonvolatile memory device 130 for reducing programming current and improving reliability. The nonvolatile memory device 130 comprises a memory cell array 1360, a word line driver 1350 and a control line driver 1351 coupled to the memory cell array 1360, a row address decoder 1340 coupled to the word line driver 1350, an address buffer 1310 coupled to the row address decoder 1340, a multiplexer 1352 coupled to the memory cell array 1360, a power generator 1330 coupled to the memory cell array 1360, the word line driver 1350, the control line driver 1351, and the multiplexer 1352, a sense amplifier 1370 coupled to the multiplexer 1352 and the memory cell array 1360, a column address decoder 1341 coupled to the sense amplifier 1370, a data I/O buffer 1380 coupled to the sense amplifier 1370, an I/O circuit 1390 coupled to the data I/O buffer 1390, and a cell operation state machine 1320 coupled to the address buffer 1310 and the power generator 1330. The memory cell array 1360 comprises memory cells, such as the memory cell 100 of FIG. 1, arranged at crossing points of a bit-line and word-line (or control line) matrix of the memory cell array 1360. The word line driver 1350, the control line driver 1351, the row address decoder 1340, and the column address decoder 1341 form a write circuit for providing multiple variable pulses or constant pulses to each control-line for programming during programming operation. The multiple variable pulses have predetermined amplitude for keeping gate injection current at a predetermined level during programming operation. The predetermined level may be roughly maximum while lowering conduction current. The multiplexer 1352, the sense amplifier 1370, the power generator 1330, and the cell operation state machine 1320 form a verification circuit for sensing variation of conduction current during the programming operation, and disabling the programming operation if the sensed conduction current during the programming operation reaches a predetermined value. The verification circuit may disable the programming operation when a predetermined programming time passes even if the sensed conduction current does not reach the predetermined value. The verification circuit may disable the programming operation when absolute value of the control-line voltage is greater than or equal to absolute value of threshold voltage. In the memory array 1360, each memory cell may be a p-channel memory cell comprising a charge storage layer. The charge storage layer may be an oxide-nitride-oxide (ONO) layer. The multiple variable pulses may further be provided to each bit-line (i.e. SL to BL bias) for programming. A multiple variable pulse pattern of the predetermined amplitude may be a step ramp or independent ramp pattern.

Figure 1:
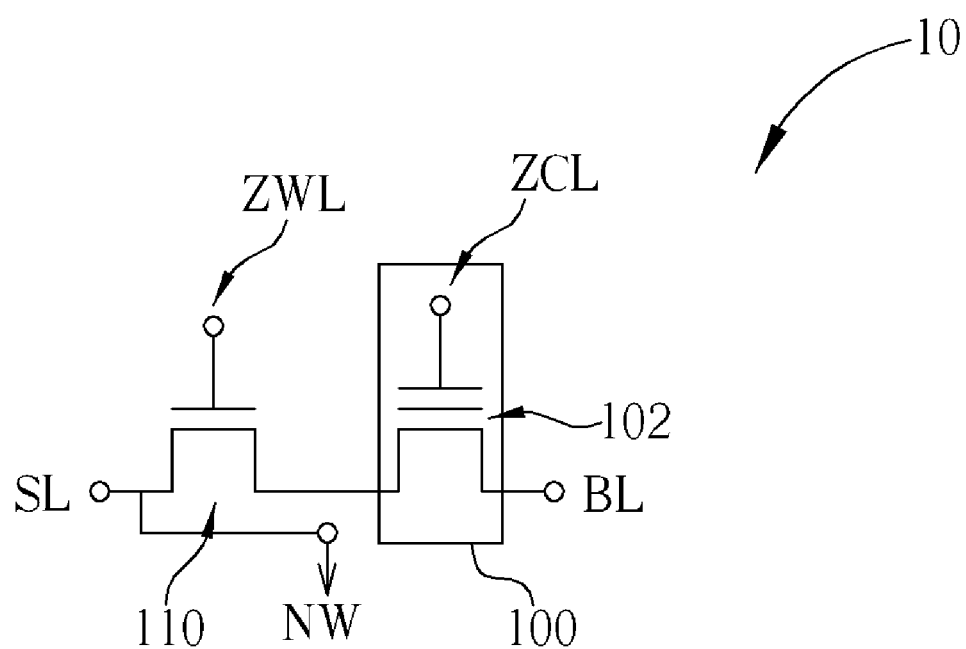
FIG. 1 is a diagram illustrating a memory cell according to the prior art.
Figure 2:
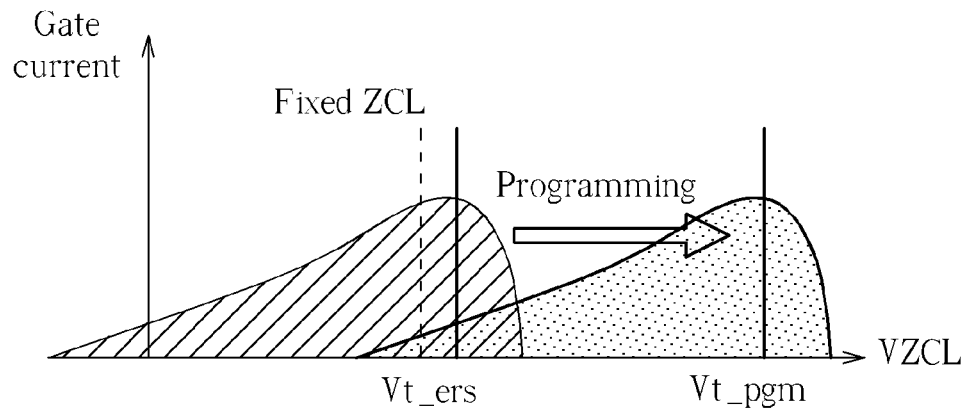
FIG. 2 is a diagram illustrating gate current versus gate voltage for a fixed control line voltage.
Figure 3:
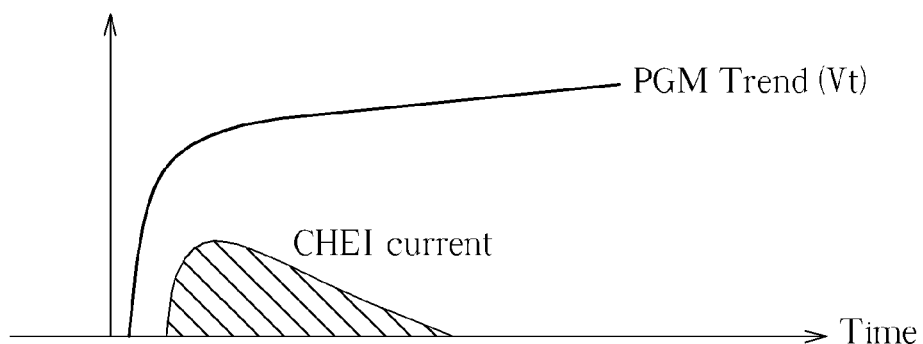
FIG. 3 is a diagram illustrating threshold voltage and CHEI current versus time for the fixed control line voltage.
Figure 18:
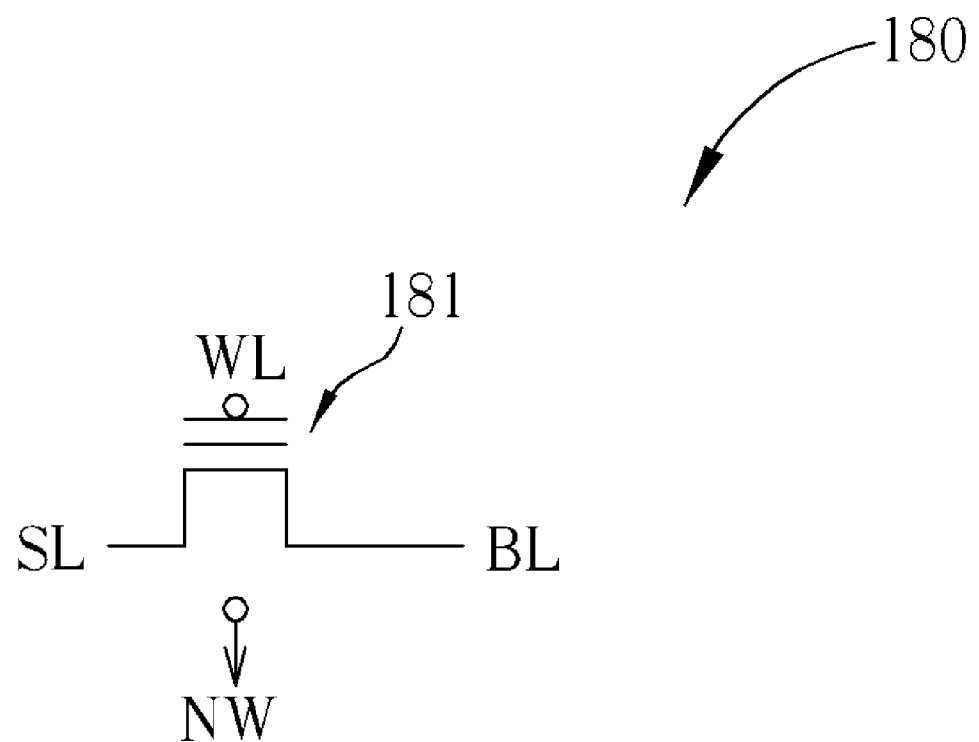
FIG. 18 is a diagram illustrating a double gate transistor according to an embodiment.

Please refer to FIG. 18, which is a diagram illustrating a double gate transistor 180 according to an embodiment. The memory cell can also be the double gate transistor 180 comprising the floating gate 181, and may also adopt ramping gate voltage to improve performance. In the above, for the memory cell 10 comprising the two transistors 100, 110, the control line voltage ZCL and/or the select line voltage SL may be ramped. For the double gate transistor 180, word line voltage WL applied to the gate of the double gate transistor 180, and bit line voltage BL applied to the drain of the double gate transistor 180 may be ramped. Ramping of the bit line voltage BL and/or the word line voltage WL shown in FIG. 18 may be accomplished in the same way described above for the control line voltage ZCL and the bit line voltage BL shown in FIG. 1. However, the respective memory cell architectures illustrated in FIG. 1 and FIG. 18 are different, such that connection of the word line voltage WL is different, and the double gate transistor 180 does not take a control line input. For the double gate transistor 180 shown in FIG. 18, for example, word line voltage WL may be ramped after the conduction current reaches a predetermined value and if the memory cell is in the slow corner, bit line voltage BL may also be ramped.

Please note that, although the above description is directed to p-type memory cells, an n-type memory cell may also adopt the same concept without departing from the teaching of the invention. Furthermore, the memory cell in FIG. 18 only represents one example. A single memory transistor containing a charge storage layer may also adopt the same concept without departing from the teaching of the invention.

From the above, it can be seen that ramping the control line voltage ZCL and/or the bit line voltage BL effectively reduces programming time, thereby increasing programming efficiency of the memory cell 10 shown in FIG. 1. Likewise, ramping the word line voltage WL and/or the bit line voltage BL effectively reduces programming time, thereby increasing programming efficiency of the double gate transistor 180 shown in FIG. 18.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of programming a nonvolatile memory cell which comprises a select transistor and a memory transistor, the method comprising:
    applying a control line voltage to a control line input of the memory transistor;
    applying a source line voltage to a source line input of the select transistor;
    sensing conduction current of the nonvolatile memory cell; and
    increasing the control line voltage applied to the control line input of the nonvolatile memory cell after the conduction current reaches a predetermined value.

2. The method of claim 1, further comprising increasing the source line voltage applied to the source line input of the select transistor when a predetermined programming time passes and the conduction current is lower than the predetermined value.

3. The method of claim 1, further comprising reducing the control line voltage to a control line standby voltage and reducing the source line voltage to a source line standby voltage when the conduction current during the programming operation reaches the predetermined value.

4. The method of claim 1, further comprising resetting the control line voltage in a subsequent cycle when the control line voltage is increased to a predetermined control line voltage limit.

5. The method of claim 1, wherein the step of increasing the source line voltage further comprising increasing the source line voltage by a first step voltage.

6. The method of claim 5, wherein the step of increasing the control line voltage further comprising increasing the control line voltage by a second step voltage.

7. The method of claim 6, wherein the first step voltage and the second step voltage are equal.

8. The method of claim 6, wherein the first step voltage and the second step voltage are not equal.

9. The method of claim 1, wherein the select transistor having a gate connected to a word line voltage, a source connected to the source line voltage, and a body connected to a NW voltage, and the memory transistor having a gate connected to the control line voltage, a drain connected to a bit line voltage, and a body connected to the NW voltage, are in series.

10. The method of claim 9, wherein the select transistor and the memory transistor are both p-channel transistors.

11. A nonvolatile memory device for reducing programming current and improving reliability, the nonvolatile memory device comprising:
    a memory cell array comprising memory cells arranged at crossing points of a bit-line and word-line matrix of the memory cell array;
    a write circuit for providing multiple variable pulses to each word-line for programming, wherein the multiple variable pulses have predetermined amplitude for keeping gate injection current at a predetermined level during programming operation; and
    a verification circuit for sensing variation of the conduction current during the programming operation, and disabling the programming operation if the sensed conduction current during the programming operation reaches a predetermined value.

12. The nonvolatile memory device of claim 11, wherein each memory cell is a p-channel memory cell comprising a charge storage layer.

13. The nonvolatile memory device of claim 12, wherein each charge storage layer is an oxide-nitride-oxide (ONO) layer.

14. The nonvolatile memory device of claim 11, wherein a multiple variable pulse pattern of the predetermined amplitude is a step ramp or independent ramp pattern.

15. The nonvolatile memory device of claim 11, wherein the write circuit further provides the multiple variable pulses to the bit-lines of the memory cell array during programming operation.

16. The nonvolatile memory device of claim 11, wherein the verification circuit disables the programming operation when a predetermined programming time passes and the sensed conduction current does not reach the predetermined value.

17. The nonvolatile memory device of claim 11, wherein the verification circuit disables the programming operation when the absolute value of word-line voltage is greater than or equal to the absolute value of threshold voltage.

18. A method of programming a nonvolatile memory cell, the method comprising:
   applying a word line voltage to a word line input of the nonvolatile memory cell;
   applying a bit line voltage to a bit line input of the nonvolatile memory cell;
   sensing conduction current of the nonvolatile memory cell; and
   increasing the word line voltage applied to the word line input of the nonvolatile memory cell after the conduction current reaches a predetermined value.

19. The method of claim 18, further comprising increasing the bit line voltage applied to the bit line input of the nonvolatile memory cell when a predetermined programming time passes and the conduction current is lower than the predetermined value.

20. The method of claim 18, further comprising reducing the word line voltage to a word line standby voltage and reducing the bit line voltage to a bit line standby voltage when the conduction current during the programming operation reaches the predetermined value.

21. The method of claim 18, further comprising resetting the word line voltage in a subsequent cycle when the word line voltage is increased to a predetermined word line voltage limit.

* * * * *